United States Patent [19]

Duhl et al.

[11] Patent Number: 4,512,817
[45] Date of Patent: Apr. 23, 1985

[54] METHOD FOR PRODUCING CORROSION RESISTANT HIGH STRENGTH SUPERALLOY ARTICLES

[75] Inventors: David N. Duhl, Newington; Otis Y. Chen, Manchester; Maurice L. Gell, Newington, all of Conn.

[73] Assignee: United Technologies Corporation, Hartford, Conn.

[21] Appl. No.: 335,962

[22] Filed: Dec. 30, 1981

[51] Int. Cl.³ .............................................. C22F 1/10
[52] U.S. Cl. ....................................... 148/3; 148/13.1; 148/31.5; 148/162; 148/404; 148/410; 428/680
[58] Field of Search ................. 148/3, 13.1, 162, 31.5, 148/404, 410; 428/678, 679, 680

[56] References Cited

U.S. PATENT DOCUMENTS 4,253,885  3/1981  Maurer et al. ...................... 148/162

Primary Examiner—R. Dean
Attorney, Agent, or Firm—Charles E. Sohl

[57] ABSTRACT

Single crystal superalloy articles of a composition similar to that of IN-939 are given a combined coating and heat treatment cycle. The cycle includes a solution treatment step, a coating application step, a post coating treatment at a temperature above the gamma prime solvus and one or more aging steps. Articles so treated have improved mechanical properties.

3 Claims, 1 Drawing Figure

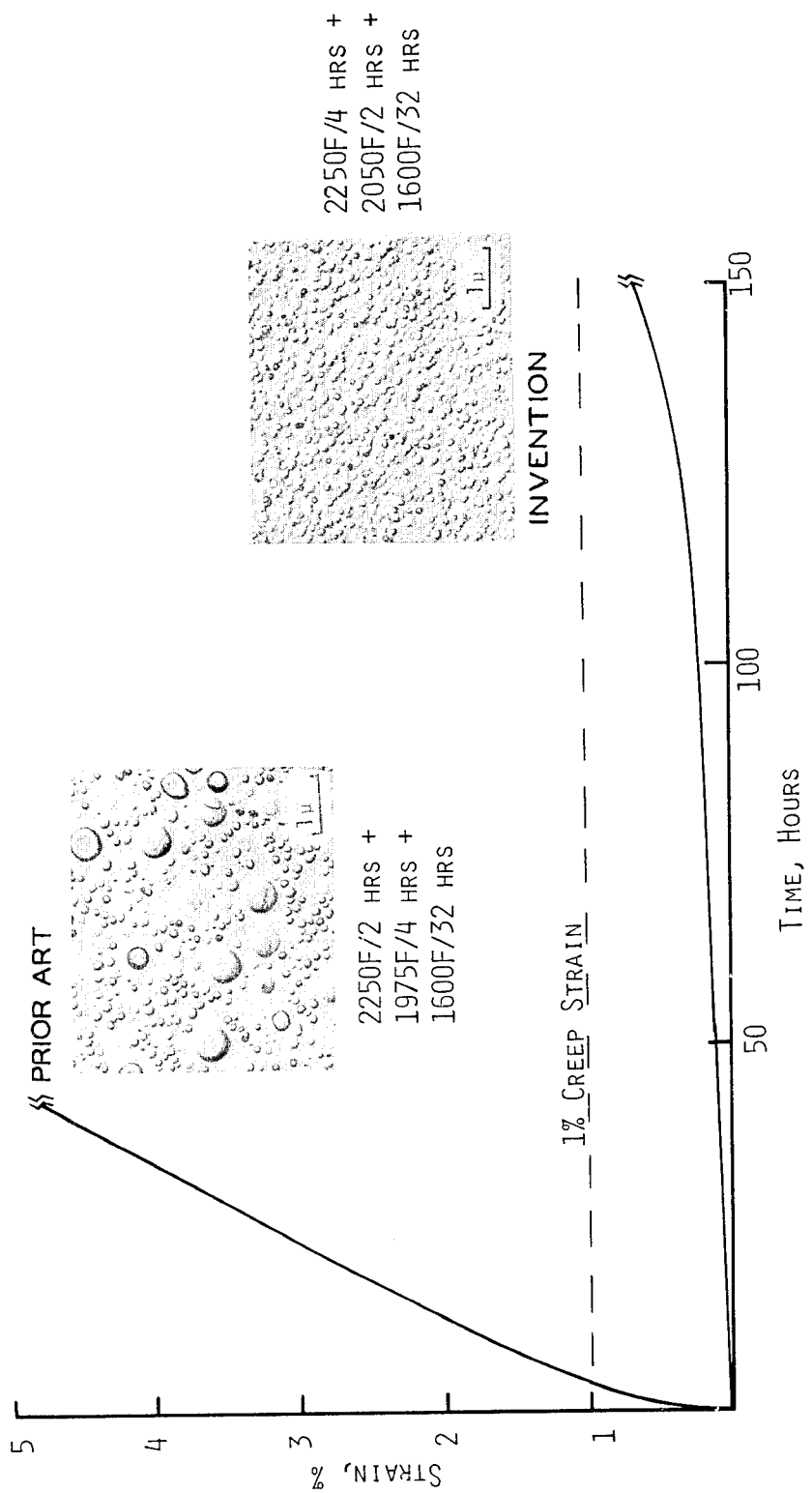

METHOD FOR PRODUCING CORROSION RESISTANT HIGH STRENGTH SUPERALLOY ARTICLES

The Government has rights in this invention pursuant to Contract No. N00024-78-C-5346 awarded by the Department of the Navy.

DESCRIPTION

1. Technical Field

This invention relates to the heat treatment and application of protective coatings to a class of high chromium containing nickel base superalloys.

2. Background Art

U.S. Pat. Nos. 4,039,330 and 4,108,647 relate to nickel base superalloy compositions similar to that employed in the present invention, although these references teach the addition of carbon, boron and zirconium which are excluded from the present invention. U.S. Pat. No. 3,898,109 teaches a specific heat treatment for improving the properties of alloys similar to those described in the present application.

U.S. Pat. No. 4,116,723 deals with the heat treatment of single crystal nickel base superalloy articles for the improvement of mechanical properties. U.S. Pat. No. 3,928,026 discloses a superior overlay coating and the method for deposition thereof including a heat treatment following deposition.

DISCLOSURE OF INVENTION

An alloy composition known in the art as IN 939 is modified by the elimination of intentional additions of carbon, boron and zirconium and thereby has its gamma prime temperature lowered and its incipient melting temperature raised. Material of this composition is solidified in single crystal form. The single crystal article is heat treated above the gamma prime solvus temperature and then has a protective coating applied. Because of the low gamma prime solvus temperature the necessary coating heat treatment can be applied under conditions at which the substrate composition is above the gamma prime solvus temperature. The alloy is subsequently aged to achieve the desired gamma prime microstructure and resultant good mechanical properties. Performance of the heat treatment above the gamma prime solvus temperature eliminates an undesirable microstructural coarsening which would otherwise occur and substantially improves the mechanical properties of the articles.

It is an object of this invention to provide a combined heat treatment and coating sequence for a class of high chromium alloys so as to provide the optimum combination of mechanical properties and coating durability.

It is a further object of this invention to provide high chromium nickel base superalloy articles which have good mechanical properties and resistance to corrosion by virtue of an adherent protective coating.

Other features and advantages will be apparent from the specification and claims and from the accompanying drawing which illustrate an embodiment of the invention.

BRIEF DESCRIPTION OF DRAWING

The FIGURE shows the microstructure and initial creep behavior of an alloy processed according to two different procedures.

BEST MODE FOR CARRYING OUT THE INVENTION

The essential steps in the invention are as follows: a composition falling within the ranges described in Table 1, free from intentional additions of carbon, boron and zirconium, is fabricated into a single crystal article. The article is initially solution treated in the temperature range between the gamma prime solvus and the incipient melting. Preferrably the temperature selected is in the upper end of the range, i.e., below but within 200° F. of the incipient melting temperature. The time of this initial heat treatment will typically be from 1–10 hours. The article is then coated using the appropriate coating process for the coating desired; either the aluminide type coating or the overlay coating, these process steps are well known in the art and will not be described here. A common feature of these coating steps is that the substrate is heated in the range of 1500°–1700° F. Exposure at these temperatures will not cause excessive coarsening of the gamma prime phase. The coated article is then given the coating heat treatment at a temperature above but near the gamma prime solvus temperature, preferably within 100° F. of the gamma prime solvus temperature for a time of 1–5 hours. During this second heat treatment above the gamma prime solvus, any precipated gamma prime is resolutioned.

Finally, the article is given the usual low temperature aging temperature for the purpose of precipitating the gamma prime phase. This step will usually be performed in the temperature range of 1200°–1800° F. for a time of 10–100 hours and may comprise a multiplicity of heat treatment steps in the range described.

The broad and preferred alloy compositions are set forth in Table 1 along with a nominal composition for commercial alloy IN 939. It can be seen that the alloy is generally similar to the IN 939 composition (alloy IN 939 is a proprietary alloy produced by the International Nickel Corporation and is apparently described in U.S. Pat. Nos. 4,039,330 and 4,108,647). As can be seen from the table, the IN 939 alloy is modified by the exclusion of carbon, boron and zirconium to arrive at the composition used in the invention. This modified invention composition is then produced in single crystal form. Appropriate casting techniques are known in the art and are described for example in U.S Pat. No. 3,494,709. Since the elements carbon, boron and zirconium act as grain boundary strengtheners, their absence in a single crystal article has no deleterious affect on mechanical properties. In a conventional polycrystalline article, the elimination of such elements would have a substantial negative affect on mechanical properties.

The elimination of the elements carbon, boron, zirconium and hafnium decreases the gamma prime solvus temperature from about 2050° F. to about 2000° F. and increases the incipient melting temperature from about 2210° F. to about 2320° F. As will be discussed below, the decrease in gamma prime solvus temperature permits the simultaneous development of high integrity coatings and high mechanical properties. The increase in the incipient melting temperature permits more effective homogenization in practical time periods for the reasons set forth in U.S. Pat. No. 4,116,723.

Essentially all superalloys used as high pressure turbine airfoils in gas turbine engines are provided with protective coatings. Notwithstanding this, it is highly desirable that the superalloy themselves be resistant to oxidation and corrosion. Corrosion resistance is largely a function of chromium content. Unfortunately, high chromium levels reduce mechanical properties. Thus there is generally a tradeoff between corrosion resistance and mechanical properties in nickel base superalloys. This invention permits a substantial increase in the strength of coated (modified) IN 939 type alloys without any decrease in corrosion resistance.

Broadly, two types of coatings are employed in the gas turbine field. These are the aluminide coatings, generally produced by the interaction of aluminum compound vapors with the surface of the article to form an aluminum rich protective surface, and the overlay coatings in which a complete layer of a corrosion resistant alloy is applied to the substrate without significant interaction with the substrate. Overlay coatings can be applied by vapor deposition or by plasma spray deposition techniques. Both types of coatings are applied at moderate substrate temperatures, i.e., 1400°–1750° F. and are subsequently given a heat treatment at a higher temperature, typically 1975° F., for the purpose of improving coating uniformity and adherence. In the case of overlay coatings, mechanical working by peening is employed prior to coating heat treatment to eliminate defects. The coating heat treatment improves coating adherence (by causing a limited amount of interdiffusion between the coating and the substrate) and, in the case of overlay coatings, causes healing of coating defects in combination with a surface peening step. The amount of the interdiffusion is controlled by the time and temperature of the heat treatment, although it obviously varies with other factors such as coating and substrate composition and coating thickness. The desired amount of interdiffusion is somewhat a matter of judgement. Typical amounts of interdiffusion (as measured by interdiffusion zone thickness) considered desirable are, about 0.5 mil for the case of overlay coatings, and about 1–2 mils in the case of aluminide coatings. Excessive interdiffusion is undesirable since it dilutes the coating composition thereby reducing its effectiveness.

The mechanical properties of superalloys are controlled by the amount and morphology of the gamma prime phase. The amount of the gamma prime phase is largely composition controlled while the morphology of the gamma prime phase is controlled by the thermal history of the alloy. In general, finer gamma prime particles produce enhanced mechanical properties. The heat treatment of superalloys is performed by heating the alloy to a temperature above the gamma prime solvus temperature so that the gamma prime is dissolved and the alloy becomes essentially a single phase; rapidly cooling the alloy, and then heating the alloy at a selected temperature below the gamma prime solvus at which the gamma prime precipitates and grows into the desired size. Generally, low aging temperatures produce finer particle sizes. There exists a range of temperature extending from the gamma prime solvus temperature to about 150° F. below the gamma prime solvus temperature in which heat treatment must be avoided because of the undesirable coarse gamma prime structure which would result. For the IN 939 alloy, this forbidden temperature range encompasses the desired coating heat treatment temperature so that up to the present the metallurgist has been faced with the choice of poor substrate properties combined with good coating properties or good substrate properties combined with poor coating properties. Through the process described herein however, one can produce a substrate whose gamma prime solvus temperature is sufficiently low so that the coating heat treatment may be performed above the gamma prime solvus temperature, still at a temperature sufficiently low that undesirable interdiffusion between the coating and the substrate is avoided.

The invention alloy composition, with its 2000° F. gamma prime solvus, is adapted to be coated and then be given a coating heat treatment above the gamma prime solvus. Subsequently, a lower temperature heat treatment to develop the gamma prime phase can be performed. This means that the prior linkage between gamma prime morphology and coating integrity is eliminated. Thus for example, the conventional coating heat treatment at 1975° F. for four hours may be replaced by a treatment at about 2050° F. for about two hours.

The beneficial results produced by the invention on mechanical properties are shown in Table 2. The table shows that going from the conventional IN 939 composition, conventionally cast and heat treated to the invention (modified alloy, single crystal, with modified heat treatment) results in an improvement in rupture life of about 4.3×. Other data in the table indicates that most of the improvement derives from the heat treatment since a sample of the modified alloy, in single crystal form, but given a conventional heat treatment was only slightly improved over the conventionally processed IN 939 material. Through the invention, a modified IN 939 type of alloy can be given mechanical properties equivalent to those of Rene 80, a widely used commercial alloy, while still maintaining the superior inherent corrosion resistance of the IN 939 type composition.

The equivalence of mechanical properties of the invention composition to those of the Rene 80 composition is especially significant when the corrosion performance of the alloy is considered. In hot corrosion testing at 1650° F. the IN 939 composition displayed a depth of attack of 5.3 mils after 500 hours while in the same test, the Rene 80 composition displayed a depth of attack of 27.7 mils. Thus the IN 939 composition was about 5× more corrosion resistant than the Rene 80 composition. In corrosion testing at 1350° F., after 500 hours of testing the IN 939 and Rene 80 samples displayed 1.3 mils of attack and 4.7 mils of attack respectively. After 1000 hours the depth of attack were 1.9 and 18.2 mils respectively, thus in testing at 1350° F., the 939 composition displayed about a 3.5× superiority after 500 hours and about 20× superiority after 1000 hours. Accordingly, the present invention presents the designer with an alloy having mechanical properties at least equal that of the Rene 80 with substantially improved corrosion resistance.

The affect of the invention process on the substrate microstructure and creep properties is further illustrated in the FIGURE. The FIGURE shows photomicrographs of the substrate microstructure after the typical prior art process as shown in U.S. Pat. No. 4,116,723 as well as the invention process. The FIGURE also shows creep curves for test conditions of 1600° F. and 40 ksi applied load. The photomicrograph of the prior art processed material shows a substantial number of gamma prime particles whose diameter exceeds 0.5 micron. This prior art processed material undergoes a substantial amount of creep in the early stages of testing and has elongated 1% in less than about 5 hours. In contrast, the invention processed material shows a gamma prime particle size on the order of 0.1–0.2 micron and even after 150 hours of testing has not elongated 1%.

The data presented in Table 2 and the FIGURE below is for single crystals in the <100> orientation. This is the orientation commonly used in gas turbine blade applications (i.e., the <100> crystal axis is oriented parallel to the longitudinal axis of the blade). Similar results are anticipated in the other principal orientations, including the <110>, <111> and <112>.

It should be understood that the invention is not limited to the particular embodiments shown and described herein, but that various changes and modifications may be made without departing from the spirit and scope of this novel concept as defined by the following claims.

TABLE 1

|    | Broad | Preferred | Nominal IN 939 |
|----|-------|-----------|----------------|
| Cr | 20–25 | 21–24     | 22.5           |
| W  | 1–5   | 1–3       | 2              |
| Ta | .5–3  | 1–2       | 1.4            |
| Al | 1–4   | 1.4–2.3   | 1.9            |
| Ti | 1.7–5 | 3.2–4.2   | 3.7            |
| Co | 15–25 | 16–22     | 19             |
| Cb | 0–3   | .5–1.5    | 1              |
| C  | *     | *         | .15            |
| Zr | *     | *         | .1             |
| B  | *     | *         | .01            |

*No intentional additions

TABLE 2

| Alloy | Heat Treatment | Test Condition | Time to 1% Creep (hrs) | Rupture (hrs) |
|-------|----------------|----------------|------------------------|---------------|
| Rene 80 | 2225° F./2 hrs<br>+2000° F./4 hrs (Coating)<br>+1925° F./4 hrs<br>+1550° F./16 hrs | 1600° F./40 ksi<br>1400° F./75 ksi | 110.0<br>120.0 | 430.0<br>760.0 |
| IN 939 (1) | 2100° F./4 hrs (Coating)<br>+1830° F./6 hrs<br>+1650° F./24 hrs<br>+1290° F./16 hrs | 1600° F./38 ksi<br>1600° F./40 ksi |  | 200<br>120 |
| Invention Alloy | 2250° F./4 hrs (Coating) | 1600° F./38 ksi | 61.7 | 259.1 |

TABLE 2-continued

| Alloy | Heat Treatment | Test Condition | Time to 1% Creep (hrs) | Rupture (hrs) |
|-------|----------------|----------------|------------------------|---------------|
| (2) | +1975° F./4 hrs<br>+1600° F./32 hrs | 1400° F./70 ksi | 17.0 | 291.4 |
| Invention Alloy (3) | 2250° F./4 hrs (Coating)<br>+2050° F./2 hrs<br>+1600° F./32 hrs | 1600° F./40 ksi<br>1400° F./75 ksi | 176.5<br>122.0 | 523.9<br>707.2 |

(1) Convention composition, conventionally cast, conventional heat treatment
(2) Invention alloy, single crystal, conventional heat treatment per U.S. Pat. No. 4,116,723
(3) Invention alloy, single crystal, invention heat treatment

We claim:

1. A method for simultaneously improving the mechanical properties of an alloy article consisting essentially of: 20–25%, Cr, 1–5% W, 0.5–3% Ta, 1–4% Al, 1.7–5% Ti, 15–25% Co, 0–3% Cb, balance essentially nickel, said alloy having a gamma prime solvus temperature and an incipient melting temperature, while at the same time applying an adherent protective coating, comprising the steps of:
   a. forming a single crystal article from the alloy;
   b. solution treating the alloy at a temperature between the gamma prime solvus temperature and the incipient melting temperature;
   c. applying a protective coating to the single crystal selected from the group consisting of aluminide coatings and overlay coatings;
   d. heat treating the coated article at a temperature above but within about 100° F. of the gamma prime solvus temperature;
   e. aging the coated article at a temperature below the gamma prime solvus temperature;

so that heat treated articles exhibit a rupture life in excess of about 400 hours when tested under conditions of 40 ksi at 1600° F. and the coating and substrate are not excessively interdiffused.

2. A method as in claim 1 in which the alloy comprises 21–24% Cr, 1–3% W, 1–2% Ta, 1.4–2.3% Al, 3.2–4.2% Ti, 16–22% Co, 0.5–1.5% Cb, balance essentially nickel.

3. A method as in claim 1 in which the solution treatment is performed at a temperature above the gamma prime solvus temperature below but within 200° F. of the incipient melting temperature.

* * * * *